(12) United States Patent
Chu et al.

(10) Patent No.: US 8,481,154 B2
(45) Date of Patent: Jul. 9, 2013

(54) BACKSHEET FOR RIGID PHOTOVOLTAIC MODULES

(75) Inventors: Lih-Long Chu, Midland, MI (US); Xuming Chen, Pearland, TX (US)

(73) Assignee: Dow GLobal Technologies Inc., Midland, MI (US)

( * ) Notice: Subject to any disclaimer, the term of this patent is extended or adjusted under 35 U.S.C. 154(b) by 277 days.

(21) Appl. No.: 12/872,028

(22) Filed: Aug. 31, 2010

(65) Prior Publication Data
US 2011/0048512 A1 Mar. 3, 2011

Related U.S. Application Data

(60) Provisional application No. 61/238,808, filed on Sep. 1, 2009.

(51) Int. Cl.
*B32B 17/10* (2006.01)
*B32B 27/00* (2006.01)
*B32B 27/08* (2006.01)
*B32B 25/16* (2006.01)

(52) U.S. Cl.
USPC ............ 428/339; 428/421; 428/500; 428/515

(58) Field of Classification Search
None
See application file for complete search history.

(56) References Cited

U.S. PATENT DOCUMENTS

| | | | |
|---|---|---|---|
| 6,521,825 B2 | 2/2003 | Miura et al. | |
| 7,355,089 B2 | 4/2008 | Chang et al. | |
| 8,431,235 B2 * | 4/2013 | Chu et al. ...................... | 428/515 |
| 2006/0199006 A1 | 9/2006 | Poon et al. | |
| 2006/0199030 A1 | 9/2006 | Liang et al. | |
| 2006/0199744 A1 | 9/2006 | Walton et al. | |
| 2006/0199872 A1 | 9/2006 | Prieto et al. | |
| 2006/0199884 A1 | 9/2006 | Hoenig et al. | |
| 2006/0199887 A1 | 9/2006 | Liang et al. | |
| 2006/0199896 A1 | 9/2006 | Walton et al. | |
| 2006/0199897 A1 | 9/2006 | Karjala et al. | |
| 2006/0199905 A1 | 9/2006 | Hughes et al. | |
| 2006/0199906 A1 | 9/2006 | Walton et al. | |
| 2006/0199907 A1 | 9/2006 | Chang et al. | |
| 2006/0199908 A1 | 9/2006 | Cheung et al. | |
| 2006/0199910 A1 | 9/2006 | Walton et al. | |
| 2006/0199911 A1 | 9/2006 | Markovich et al. | |
| 2006/0199912 A1 | 9/2006 | Fuchs et al. | |
| 2006/0199914 A1 | 9/2006 | Harris et al. | |
| 2006/0199930 A1 | 9/2006 | Li Pi Shan et al. | |
| 2006/0199931 A1 | 9/2006 | Poon et al. | |
| 2006/0199983 A1 | 9/2006 | Kammerhofer et al. | |
| 2008/0302417 A1 | 12/2008 | Inoue et al. | |
| 2009/0274912 A1 * | 11/2009 | Bonnet ........................ | 428/422 |

FOREIGN PATENT DOCUMENTS

| | | |
|---|---|---|
| WO | 9522844 | 8/1995 |
| WO | 9904971 | 2/1999 |
| WO | 9905206 | 2/1999 |
| WO | 2004055908 | 7/2004 |
| WO | 2005090427 | 9/2005 |

* cited by examiner

*Primary Examiner* — Sheeba Ahmed
(74) *Attorney, Agent, or Firm* — Stephen T. Falk

(57) ABSTRACT

The backsheet comprises a coextruded multilayer sheet that comprises:
i) an inner layer comprising a polyolefin resin;
ii) a core layer comprising a polypropylene resin, a blend of a polypropylene resin and a maleic anhydride grafted polypropylene (MAH-g-PP), or a polypropylene resin/MAH-g-PP multilayer structure;
iii) an outer layer comprising a maleic anhydride grafted polyvinylidene fluoride (MAH-g-PVDF), a blend of a polyvinylidene fluoride (PVDF) and a MAH-g-PVDF, or a PVDF/MAH-g-PVDF multilayer structure;
iv) a first tie layer between the core layer and the outer layer; and
v) an optional second tie layer between the core layer and the inner layer.

19 Claims, 3 Drawing Sheets

| MAH-g-PVDF or PVDF/MAH-g-PVDF blend |
|---|
| E-GMA |
| PP or PP/MAH-g-PP blend |

FIG. 1a

| PVDF |
|---|
| MAH-g-PVDF |
| E-GMA |
| PP or PP/MAH-g-PP blend |

FIG. 1b

| PVDF |
|---|
| MAH-G-PVDF |
| E-GMA |
| MAH-g-PP |
| PP |

FIG. 1c

| MAH-g-PVDF or PVDF/MAH-g-PVDF blend |
| :---: |
| E-GMA |
| PP or PP/MAH-g-PP blend |
| EMA or other tie layer |
| polyolefin |

FIG. 2a

| PVDF |
| :---: |
| MAH-g-PVDF |
| E-GMA |
| PP or PP/MAH-g-PP bland |
| EMA or other tie layer |
| polyolefin |

FIG. 2b

| PVDF |
| :---: |
| MAH-G-PVDF |
| E-GMA |
| MAH-g-PP |
| PP |
| EMA or other tie layer |
| polyolefin |

FIG. 2c

| MAH-g-PVDF or PVDF/MAH-g-PVDF blend |
|---|
| E-GMA |
| PP or PP/MAH-g-PP blend |
| Optional tie layer |
| encapsulant film |

FIG. 3a

| PVDF |
|---|
| MAH-g-PVDF |
| E-GMA |
| PP or PP/MAH-g-PP bland |
| Optional tie layer |
| encapsulant film |

FIG. 3b

| PVDF |
|---|
| MAH-G-PVDF |
| E-GMA |
| MAH-g-PP |
| PP |
| Optional tie layer |
| encapsulant film |

FIG. 3c

BACKSHEET FOR RIGID PHOTOVOLTAIC MODULES

FIELD OF THE INVENTION

This invention relates to electronic device modules. In one aspect, the invention relates to electronic device modules comprising an electronic device, e.g., a solar cell, and a protective polymeric material while in another aspect, the invention relates to electronic device modules in which the protective polymeric material is a multilayer polymeric sheet comprising a fluoro-polymer and polyolefins. In yet another aspect, the invention relates to a method of making an electronic device module.

BACKGROUND OF THE INVENTION

Polymeric materials are commonly used in the manufacture of modules comprising one or more electronic devices including, but not limited to, solar cells (also known as photovoltaic cells) (or PV cells), liquid crystal panels, electroluminescent devices and plasma display units. The modules often comprise an electronic device in combination with one or more substrates, e.g., one or more glass cover sheets, often positioned between two substrates in which one or both of the substrates comprise glass, metal, plastic, rubber or another material. The polymeric materials are typically used as the encapsulant or sealant for the module or, depending upon the design of the module, as a skin layer component of the module, e.g., a backskin in a solar cell module. Typical polymeric materials for these purposes include silicone resins, epoxy resins, polyvinyl butyral resins, cellulose acetate, ethylene-vinyl acetate copolymer (EVA) and ionomers.

A multi-layer polymeric sheet is frequently used as the backsheet (or backskin, substrate) for solar cell (photovoltaic) modules. The sheet can comprise a first polymer layer comprising a film of polyvinyl fluoride (PVF) or polyvinylidene fluoride (PVDF) having an adhesive coating on one side, a second optionally pigmented polymer layer extruded on the adhesive coating of the first polymer layer; and, optimally, a third polymer layer for providing the moisture barrier and dielectric insulation. The sheet is required to have good adhesion strength to the encapsulant, mechanical strength, electrical insulation, and moisture blocking to protect the solar cells and metallic components in modules from environmental elements. Further, the backsheet must be electrically insulating to prevent a conduction path from the back contacts of the device to the grounded metal frame. The backsheet material must also prevent moisture ingress because this is the generally accepted mode of failure for devices that do not pass the IEEE 1262 qualification test. IEEE 1262 is commonly referred to as the "damp heat test" and for part of the test PV devices are subjected to 85° C. and 85% relative humidity (RH) for 1000 hours as per the specification. Thus, good polymeric backsheet materials are required to have good adhesion with the encapsulant, good electric insulation, mechanical strength, and moisture blocking to protect the solar cell and metallic components in modules from environmental elements.

Current backsheets require more than one processing step to make. Frequently, the individual film layers are each made separately and then laminated together, often with intermediate adhesive layers. For example, U.S. Pat. No. 6,521,825 B2 discloses a solar cell module comprising a three-layer laminated film. Two of the layers are heat and weather resistant while the core layer is moisture resistant.

Currently, several multilayer films are used as the backsheet for PV module, such as TEDLAR®/PET/TEDLAR®, TEDLAR®/PET/EVA, and TEDLAR®/Aluminum foil/TEDLAR®. TEDLAR® is a registered trademark of DuPont for polyvinyl fluoride, PET is polyethylene terephthalate, and EVA is ethylene vinyl acetate. These multi-layer materials provide adequate mechanical strength and UV stability, but the moisture barrier property is not good enough for solar cell long term durability. Aluminum foil has been used as the central layer to provide moisture barrier properties, but the industry has concerns that putting a conductive layer inside the backsheet might compromise the long-term dielectric property of the backsheet.

EVA copolymers with a high content (28 to 35 wt %) of units derived from the vinyl acetate monomer are commonly used to make encapsulant film for use in photovoltaic (PV) modules. See, for example, WO 95/22844, 99/04971, 99/05206 and 2004/055908. EVA resins are typically stabilized with ultra-violet (UV) light additives, and they are typically crosslinked during the solar cell lamination process using peroxides to improve heat and creep resistance to a temperature between about 80° C. and 90° C. However, EVA resins are less than ideal PV cell encapsulating film material for several reasons. For example, EVA film progressively darkens in intense sunlight due to the EVA resin chemically degrading under the influence of UV light. This discoloration can result in a greater than 30% loss in power output of the solar module after as little as four years of exposure to the environment. EVA resins also absorb moisture and are subject to decomposition.

Recent development in thin film photovoltaic technologies, such as $CuInGaSe_2$ (CIGS) polycrystalline thin film photo-voltaic cells, also require a better moisture barrier property from the PV module backsheet. Backsheets with an EVA layer used for a CIGS PV module have problems passing the "damp heat test" (85° C. and 85% relative humidity (RH) for 1000 hours as per the specification). Thus, a backsheet material that has good adhesion to the encapsulant, good electric insulation, mechanical strength, and moisture blocking is needed for the PV industry.

SUMMARY OF THE INVENTION

In one embodiment, the invention is a backsheet comprising a coextruded multilayer sheet that comprises: i) an inner layer comprising a polyolefin resin; ii) a core layer comprising a polypropylene resin, a blend of a polypropylene resin and a maleic anhydride grafted polypropylene (MAH-g-PP), or a polypropylene resin/MAH-g-PP multilayer structure; iii) an outer layer comprising a maleic anhydride grafted polyvinylidene fluoride (MAH-g-PVDF), a blend of a polyvinylidene fluoride (PVDF) and a MAH-g-PVDF, or a PVDF/MAH-g-PVDF multilayer structure; iv) a first tie layer between the core layer and the outer layer; and v) an optional second tie layer between the core layer and the inner layer.

In another embodiment, the invention is a rigid photovoltaic cell panel, comprising: a photovoltaic cell and a backsheet comprising a coextruded multilayer sheet that comprises: i) an inner layer comprising a polyolefin resin; ii) a core layer comprising a polypropylene resin, a blend of a polypropylene resin and a maleic anhydride grafted polypropylene (MAH-g-PP), or a polypropylene resin/MAH-g-PP multilayer structure; iii) an outer layer comprising a maleic anhydride grafted polyvinylidene fluoride (MAH-g-PVDF), a blend of a polyvinylidene fluoride (PVDF) and a MAH-g-PVDF, or a PVDF/MAH-g-PVDF multilayer structure; iv) a first tie layer between the core layer and the outer layer; and v) an optional second tie layer between the core layer and the inner layer.

In yet another embodiment, the invention is a backsheet comprising a coextruded multilayer sheet, the sheet comprising: a first layer comprising: (1) a blend of PVDF and MAH-g-PVDF; (2) MAH-g-PVDF; or (3) a two-layer structure comprising a layer of PVDF and a layer of MAH-g-PVDF; a second layer comprising: (1) a polypropylene resin; (2) a blend of a polypropylene resin and a maleic anhydride grafted polypropylene (MAH-g-PP); or, (3) a two-layer structure comprising a layer of polypropylene resin and a layer of MAH-g-PP; and a first tie layer interposed between, and in contact with, the first layer and the second layer, the first tie layer comprising at least one of an ethylene methacrylate resin (EMA), an ethylene glycidyl methacrylate resin (E-GMA), or an ethylene-methyl acrylate-glycidyl methacrylate resin (E-MA-GMA) or a polyolefin having a functionality including a glycidyl methacrylate and an amine, wherein: (1) when the first layer comprises a two-layer structure, then the layer of MAH-g-PVDF is in contact with the first tie layer; and, (2) when the second layer comprises a two-layer structure, then the layer of MAH-g-PP is in contact with the first tie layer.

The invention includes methods for making the backsheet and articles produced from the backsheet.

BRIEF DESCRIPTION OF THE DRAWINGS

FIGS. 1a, b, c each show a schematic of a three layer test segment of an embodiment of a backsheet of the invention.

FIGS. 2a, b, and c each show a schematic of a backsheet made from the segments shown in FIG. 1.

FIGS. 3a, b, and c each show an alternative embodiment of the backsheets shown in FIG. 2.

DESCRIPTION OF THE PREFERRED EMBODIMENTS

Definitions:

The numerical ranges in this disclosure include all values from and including the lower and the upper values, in increments of one unit, provided that there is a separation of at least two units between any lower value and any higher value. As an example, if a compositional, physical or other property, such as, for example, molecular weight, viscosity, melt index, etc., is from 100 to 1,000, it is intended that all individual values, such as 100, 101, 102, etc., and sub ranges, such as 100 to 144, 155 to 170, 197 to 200, etc., are expressly enumerated. For ranges containing values which are less than one or containing fractional numbers greater than one (e.g., 1.1, 1.5, etc.), one unit is considered to be 0.0001, 0.001, 0.01 or 0.1, as appropriate. For ranges containing single digit numbers less than ten (e.g., 1 to 5), one unit is typically considered to be 0.1. These are only examples of what is specifically intended, and all possible combinations of numerical values between the lowest value and the highest value enumerated, are to be considered to be expressly stated in this disclosure. Numerical ranges are provided within this disclosure for, among other things, melt index, molecular weight distribution (Mw/Mn), percent crystallinity, percent comonomer, and the number of carbon atoms in the comonomer.

"Composition" and like terms mean a mixture of two or more materials. Included in compositions are pre reaction, reaction and post-reaction mixtures the latter of which will include reaction products and by-products as well as unreacted components of the reaction mixture and decomposition products, if any, formed from the one or more components of the pre-reaction or reaction mixture.

"Blend", "polymer blend" and like terms mean a composition of two or more polymers. Such a blend may or may not be miscible. Such a blend may or may not be phase separated. Such a blend may or may not contain one or more domain configurations, as determined from transmission electron spectroscopy, light scattering, x-ray scattering, and any other method known in the art. Blends are not laminates, but one or more layers of a laminate can comprise a blend.

"Polymer" means a polymeric compound prepared by polymerizing monomers, whether of the same or a different type. The generic term polymer thus embraces the term homopolymer, usually employed to refer to polymers prepared from only one type of monomer, and the term interpolymer as defined below.

"Interpolymer" means a polymer prepared by the polymerization of at least two different monomers. This generic term includes copolymers, usually employed to refer to polymers prepared from two different monomers, and polymers prepared from more than two different monomers, e.g., terpolymers, tetrapolymers, etc.

"Olefin-based polymer", "polyolefin", "PO" and like terms means a polymer that comprises more than 50 mole percent units derived from polymerized olefin monomer, for example ethylene or propylene (based on the total amount of polymerizable monomers). Representative polyolefins include polyethylene, polypropylene, polybutene, polyisoprene and their various interpolymers. In the context of this disclosure, "olefin-based polymer" and like terms explicitly exclude olefin multi-block interpolymers.

"Olefin multi-block interpolymer", "multi-block interpolymer", "multi-block copolymer", "segmented copolymer" and like terms refer to a polymer comprising two or more chemically distinct regions or segments (referred to as "blocks") preferably joined in a linear manner, that is, a polymer comprising chemically differentiated units which are joined end-to-end with respect to polymerized ethylenic functionality, rather than in pendent or grafted fashion. In a preferred embodiment, the blocks differ in the amount or type of incorporated comonomer, density, amount of crystallinity, crystallite size attributable to a polymer of such composition, type or degree of tacticity (isotactic or syndiotactic), regio-regularity or regio-irregularity, amount of branching (including long chain branching or hyper-branching), homogeneity or any other chemical or physical property. Compared to block copolymers of the prior art, including copolymers produced by sequential monomer addition, fluxional catalysts, or anionic polymerization techniques, the multi-block copolymers used in the practice of this invention are characterized by unique distributions of both polymer polydispersity (PDI or Mw/Mn or MWD), block length distribution, and/or block number distribution, due, in a preferred embodiment, to the effect of the shuttling agent(s) in combination with multiple catalysts used in their preparation. More specifically, when produced in a continuous process, the polymers desirably possess PDI from 1.7 to 3.5, preferably from 1.8 to 3, more preferably from 1.8 to 2.5, and most preferably from 1.8 to 2.2. When produced in a batch or semi-batch process, the polymers desirably possess PDI from 1.0 to 3.5, preferably from 1.3 to 3, more preferably from 1.4 to 2.5, and most preferably from 1.4 to 2. In the context of this disclosure, "olefin multi-block interpolymer" and like terms explicitly exclude olefin-based polymers. Representative olefin multi-block interpolymers include the olefin multi-block interpolymers manufactured and sold by The Dow Chemical Company under the trademark INFUSE™.

"Ethylene multi-block copolymer" and like terms means a multi-block copolymer comprising units derived from ethylene and one or more copolymerizable comonomers, in which the ethylene-derived units comprise a plurality of the polymerized monomer units of at least one block or segment in the polymer, preferably at least 90, more preferably at least 95 and most preferably at least 98, mole percent of the block. Based on total polymer weight, the ethylene multi-block copolymers used in the practice of the present invention preferably have an ethylene content from 25 to 97, more preferably from 40 to 96, even more preferably from 55 to 95 and most preferably from 65 to 85, percent.

"Ethylene-based polymer" and like terms means an olefin-based polymer that comprises more than 50 mole percent polymerized ethylene monomer (based on the total amount of polymerizable monomers). As used in the context of this disclosure, ethylene-based polymer and like terms explicitly excludes ethylene multi-block interpolymers.

"Ethylene/α-olefin interpolymer" and like terms means an olefin-based interpolymer that comprises more than 50 mole percent polymerized ethylene monomer (based on the total amount of polymerizable monomers), and at least one α-olefin. As used in the context of this disclosure, ethylene/α-olefin interpolymer and like terms explicitly excludes ethylene/α-olefin multi-block interpolymers.

"Random ethylene/α-olefin interpolymer" and like terms are used in this disclosure consistent with their use in the art in reference to polymers, and they refer to ethylene-based interpolymers in which the comonomer(s) is/are randomly distributed along the polymer chain. As used in the context of this disclosure, random ethylene/α-olefin interpolymer and like terms explicitly excludes ethylene/α-olefin multi-block interpolymers.

"Propylene-based polymer" and like terms means an olefin-based polymer that comprises more than 50 mole percent polymerized propylene monomer (based on the total amount of polymerizable monomers). As used in the context of this disclosure, propylene-based polymer and like terms explicitly excludes propylene multi-block interpolymers.

"Propylene/α-olefin interpolymer" and like terms means an interpolymer that comprises more than 50 mole percent polymerized propylene monomer (based on the total amount of polymerizable monomers), and at least one α-olefin. As used in the context of this disclosure, propylene/α-olefin interpolymer and like terms explicitly excludes propylene/α-olefin multi-block interpolymers.

The term, "propylene/ethylene interpolymer" and like terms means an interpolymer that comprises more than 50 mole percent polymerized propylene monomer (based on the total amount of polymerizable monomers) with the remainder of the interpolymer comprising at least some, e.g., typically at least 1 mole percent, polymerized ethylene monomer. This term, as used herein, does not refer to a propylene/ethylene multi-block interpolymer.

"Laminates", "laminations" and like terms mean two or more layers, e.g., film layers, in intimate contact with one another Laminates include molded articles bearing a coating. Laminates are not blends, although one or more layers of a laminate may comprise a blend.

The backsheet of the current invention is made in a single step coextrusion process. The backsheet comprises at least three primary layers with tie layers in between the primary layers. The first primary layer, or inner layer, needs to allow for good adhesion between the backsheet and the electronic device. The first layer typically comprises a polyolefin that provides good adhesion between polypropylene and the materials used in the encapsulant layers. Suitable polyolefins include ethylene homopolymers or copolymers of ethylene, especially heterogeneously branched linear ethylene-based interpolymers, and ethylene microblock copolymers.

Heterogeneously branched linear ethylene-based interpolymers differ from the homogeneously branched ethylene-based interpolymers, primarily in their comonomer branching distribution. For example, heterogeneously branched interpolymers have a branching distribution, in which the polymer molecules do not have the same ethylene-to-comonomer ratio. Heterogeneously branched ethylene-based interpolymers are typically prepared with a Ziegler/Natta catalyst system. These linear interpolymers lack long chain branching (or measurable amounts of long chain branching).

Heterogeneously branched ethylene-based interpolymers include, but are not limited to, linear medium density polyethylene (LMDPE), linear low density polyethylene (LLDPE), very low density polyethylene (VLDPE), and ultra low density polyethylene (ULDPE). Commercial polymers include DOWLEX™ polymers, ATTANE™ polymer and FLEXOMER™ polymers (all from The Dow Chemical Company), and ESCORENE™ AND EXCEED™ polymers (both from Exxon Mobil).

The inner layer may also comprise a maleic anhydride containing copolymer or maleic anhydride modified polyolefin, which can form a strong chemical bond with a tie layer polymer having a functionality such as a glycidyl methacrylate (GMA), an amine, etc. Commercial polymers include BYNEL™ polymers (from DuPont), maleic anhydride modified ethylene vinyl acetate polymers.

The inner layer may also comprise color pigments, typically white. A suitable pigment is AMPACET™ 11560 white pigment and can be added in amounts of about 8% based on the weight of the inner layer. Other optional components include UV stabilizers and antioxidants such as 0.6 wt % CYASORB™ UV 3853 PPS, 0.3 wt % CYASORB™ 2001, 0.2 wt % UVINAL™ 5050H, 0.1 wt % TINUVIN™ 770, and 0.025 wt % IRGANOX™ 1010, all percentages based on the weight of polyolefin resin. The inner layer typically has a thickness of about 1 mil to about 5 mil.

The second primary layer, the core layer, provides dimensional stability. The second layer typically comprises a polypropylene resin or a blend of a polypropylene resin and a maleic anhydride grafted polypropylene (MAH-g-PP) or a polypropylene/MAH-g-PP multilayer structure.

Suitable propylene-based polymers include propylene homopolymers, propylene interpolymers, as well as reactor copolymers of polypropylene (RCPP), which can contain about 1 to about 20 wt % ethylene or an α-olefin comonomer of 4 to 20 carbon atoms. The polypropylene homopolymer can be isotactic, syndiotactic or atactic polypropylene. The propylene interpolymer can be a random or block copolymer, or a propylene-based terpolymer. In another embodiment, the propylene-based polymers can be nucleated. "Nucleated" and similar terms refer to a polymer that has been modified by addition of a nucleating agent such as Millad®, a dibenzyl sorbitol commercially available from Milliken. Other conventional nucleating agents may also be used.

The propylene polymer may be crystalline, semi-crystalline or amorphous. A crystalline polypropylene polymer typically has at least 90 mole percent of its repeating units derived from propylene, preferably at least 97 percent, more preferably at least 99 percent.

Suitable comonomers for polymerizing with propylene include ethylene, 1-butene, 1 pentene, 1-hexene, 1-heptene, 1-octene, 1-nonene, 1-decene, 1-unidecene, 1-dodecene, as well as 4-methyl-1-pentene, 4-methyl-1-hexene, 5-methyl-1-hexene, vinylcyclohexane, and styrene. The preferred comonomers include ethylene, 1-butene, 1-hexene, and 1-octene, and more preferably ethylene. As here used, in reference to propylene-based polymers only, propylene/olefin interpolymer specifically includes propylene/ethylene interpolymer.

Optionally, the propylene-based polymer comprises monomers having at least two double bonds which are preferably dienes or trienes. Suitable diene and triene comonomers include 7 methyl-1,6-octadiene; 3,7-dimethyl-1,6-octadiene; 5,7-dimethyl-1,6-octadiene; 3,7,11 trimethyl-1,6,10-octatriene; 6-methyl-1,5heptadiene; 1,3-butadiene; 1,6-heptadiene; 1,7 octadiene; 1,8-nonadiene; 1,9-decadiene; 1,10-undecadiene; norbornene; tetracyclododecene; or mixtures thereof; and preferably butadiene; hexadienes; and octadienes; and most preferably 1,4-hexadiene; 1,9-decadiene; 4-methyl-1,4-hexadiene; 5-methyl-1,4-hexadiene; dicyclopentadiene; and 5-ethylidene-2-norbornene (ENB).

Additional unsaturated comonomers include 1,3-butadiene, 1,3-pentadiene, norbornadiene, and dicyclopentadiene; C8-40 vinyl aromatic compounds including styrene, o-, m-, and p-methylstyrene, divinylbenzene, vinylbiphenyl, vinylnapthalene; and halogen-substituted C8-40 vinyl aromatic compounds such as chlorostyrene and fluorostyrene.

The propylene copolymers of particular interest include propylene/ethylene, propylene/1 butene, propylene/1-hexene, propylene/4-methyl-1-pentene, propylene/1-octene, propylene/ethylene/1-butene, propylene/ethylene/ENB, propylene/ethylene/1-hexene, propylene/ethylene/1-octene, propylene/styrene, and propylene/ethylene/styrene.

Suitable polypropylenes are formed by means within the skill in the art, for example, using single site catalysts (metallocene or constrained geometry) or Ziegler Natta catalysts. The propylene and optional comonomers, such as ethylene or alpha-olefin monomers are polymerized under conditions within the skill in the art, for instance, as disclosed by Galli, et al., Angew. Macromol. Chem., Vol. 120, 73 (1984), or by E. P. Moore, et al. in Polypropylene Handbook, Hanser Publishers, New York, 1996, particularly pages 11-98.

The following are illustrative but non-limiting polypropylene polymers that can be used in the compositions of this invention: PROFAX™ SR-256M, a clarified polypropylene copolymer resin with a density of 0.90 g/cc and a MFR of 2 g/10 min, PROFAX™ 8623, an impact polypropylene copolymer resin with a density of 0.90 g/cc and a MFR of 1.5 g/10 min, and CATALLOY™ in-reactor blends of polypropylene (homo- or copolymer) with one or more of propylene-ethylene or ethylene-propylene copolymer, the blends having a wide range of densities and MFR, all available from Basell (Elkton, Md.); VERSIFY™ Plastomers and Elastomers available from The Dow Chemical Company and available as propylene/ethylene copolymers with densities ranging from 0.86 to 0.89 g/cc, and MFR ranging from 2 to 25 g/10 min; and INSPIRE™ D114 branched impact copolymer with a melt flow index of 0.5 μg/min (230 C/2.16 kg) and a melting point of 164 C and available from The Dow Chemical Company. Other polypropylene polymers include Shell's KF 6100 homopolymer polypropylene; Solvay's KS 4005 polypropylene copolymer and Solvay's KS 300 polypropylene terpolymer.

Preparation of MAH-g-PP resins is well known in the art and these resins are commercially available, for example, POLYBOND® Resins from Chemtura.

The core layer may also comprise color pigments, typically white. A suitable pigment is AMPACET 11343 white pigment and can be added in amounts of about 8% based on the weight of the inner layer. Other optional components include UV stabilizers such as 0.6 wt % CYASORB UV 3853 PPS, 0.3 wt % CYASORB THT 2001, 0.2 wt % UVINAL 5050H, 0.1 wt % TINUVIN 770, and 0.025 wt % IRGANOX 1010, all percentages based on the weight of polyolefin resin. The core layer typically has a thickness between about 1 mil and about 15 mil, preferably between about 1 and about 5 mil.

The third layer, or outer layer, provides weatherability, environmental and water vapor protection. The outer layer can comprise a maleic anhydride grafted polyvinylidene fluoride (MAH-g-PVDF), a blend of a polyvinylidene fluoride (PVDF) and a MAH-g-PVDF, or a PVDF/MAH-g-PVDF multilayer structure.

The outer layer may also comprise color pigments, typically white. A suitable pigment is KynarFlex™ white concentrate (from Chromatics) and can be added in amounts of about 10% based on the weight of the inner layer. Other optional components include UV stabilizers and antioxidants. The outer layer typically has a thickness of about 1 mil to about 5 mil.

The backsheet is coextruded with a tie layer between the core layer and the outer layer. A tie layer can also be present between the core layer and the inner layer (or the encapsulant layer if no inner layer is present in an embodiment). The tie layer comprises a copolymer or a terpolymer having a glycidyl methacrylate (GMA) functionality, which can react with a maleic anhydride. The tie layer also comprises a polymer modified by such functionality including a glycidyl methacrylate (GMA), an amine, etc. The copolymer comprises an ethylene-glycidyl methacrylate copolymer (E-GMA) copolymer. The terpolymer comprises an ethylene-methyl acrylate-glycidyl methacrylate terpolymer (E-MA-GMA) terpolymer. E-GMA copolymers and E-MA-GMA terpolymers are also commercially available. Suitable E-GMA copolymers include LOTADER AX8840 ethylene-glycidyl methacrylate copolymers. Suitable E-MA-GMA terpolymers include LOTADER AX8950 ethylene-methyl acrylate-glycidyl methacrylate terpolymers.

The tie layer may also comprise UV stabilizers and antioxidants such as 0.6 wt % CYASORB UV 3853 PPS, 0.3 wt % CYASORB THT 2001, 0.2 wt % UVINAL 5050H, 0.1 wt % TINUVIN 770, and 0.025 wt % IRGANOX 1010, all percentages based on the weight of polyolefin resin. Each tie layer typically has a thickness of about 0.05 mil to about 2 mil.

In some embodiments, an E-GMA based tie layer is used in conjunction with a primary layer that comprises a maleic anhydride (MAH) grafted polymer. This embodiment improves the binding between the layers because the MAH reacts with the E-GMA to form a strong chemical bond. Blends of the MAH grafted polymer with a non-MAH grafted polymer can be used to reduce cost. FIG. 1a shows a section of a backsheet of this embodiment. FIGS. 1b and 1c show alternatives of this embodiment in which one or more of the primary layers are split into multiple layers to decrease cost by having a separate layer of MAH grafted polymer in contact with the tie layer.

FIGS. 2a, 2b, and 2c show resulting structures for the backsheet based on the segments shown in FIGS. 1a, 1b, and 1c, respectively.

The backsheet structures shown in FIGS. 2a, 2b, and 2c can be further simplified in some embodiments by eliminating the inner layer and replacing it with an encapsulant film, as shown in FIGS. 3a, 3b, and 3c. The encapsulant film can be an EVA or a silane functionalized polymer, such as silane grafted olefin elastomer or silane grafted multi-block copolymer.

Regarding the olefin multi-block interpolymers useful in the practice of this invention, these are described in the context of ethylene multi-block copolymers with the understanding that these copolymers are exemplary of the olefin multi-block interpolymers in general.

The ethylene multi-block copolymers are made with two catalysts incorporating differing quantities of comonomer, and these copolymers have a weight ratio of blocks from 95:5 to 5:95. The elastomeric polymers desirably have an ethylene content of from 20 to 90 percent, optionally a diene content of from 0.1 to 10 percent, and an -olefin content of from 10 to 80 percent, based on the total weight of the polymer. Further preferably, the multi-block elastomeric polymers of this embodiment have an ethylene content of from 60 to 90 percent, a diene content of from 0.1 to 10 percent, and an -olefin content of from 10 to 40 percent, based on the total weight of the polymer. Preferred polymers are high molecular weight polymers, having a weight average molecular weight (Mw) from 10,000 to about 2,500,000, preferably from 20,000 to 500,000, more preferably from 20,000 to 350,000; a polydispersity less than 3.5, more preferably less than 3 and as low as about 2; and a Mooney viscosity (ML (1+4)125 C.) from 1 to 250. More preferably, such polymers have an ethylene content from 65 to 75 percent, a diene content from 0 to 6 percent, and an -olefin content from 20 to 35 percent.

The ethylene multi-block copolymers useful in the practice of this invention have a density of less than about 0.90, preferably less than about 0.89, more preferably less than about 0.885, even more preferably less than about 0.88 and even more preferably less than about 0.875, g/cc. The ethylene multi-block copolymers typically have a density greater than about 0.85, and more preferably greater than about 0.86, g/cc. Density is measured by the procedure of ASTM D-792. Low density ethylene multi-block copolymers are generally characterized as amorphous, flexible and having good optical properties, e.g., high transmission of visible and UV-light and low haze.

The ethylene multi-block copolymers useful in the practice of this invention typically have a melting point of less than about 125. The melting point is measured by the differential scanning calorimetry (DSC) method described in WO 2005/090427 (US2006/0199930). Ethylene multi-block copolymers with a low melting point often exhibit desirable flexibility and thermoplasticity properties useful in the fabrication of the modules of this invention.

The ethylene multi-block copolymers used in the practice of this invention, and their preparation and use, are more fully described in U.S. Pat. No. 7,355,089, WO 2005/090427, US2006/0199931, US2006/0199930, US2006/0199914, US2006/0199912, US2006/0199911, US2006/0199910, US2006/0199908, US2006/0199907, US2006/0199906, US2006/0199905, US2006/0199897, US2006/0199896, US2006/0199887, US2006/0199884, US2006/0199872, US2006/0199744, US2006/0199030, US2006/0199006 and US2006/0199983.

The multilayer backsheet is formed by coextrusion, which is a well-known technique in the art. Multilayer film manufacturing techniques are described in The Encyclopedia of Chemical Technology, Kirk-Othmer, Third Edition, John Wiley & Sons, New York, 1981, Vol. 16, pp. 416-417 and Vol. 18, pp. 191-192; Packaging Foods With Plastics, by Wilmer A. Jenkins and James P. Harrington (1991), pp. 19-27; "Coextrusion Basics" by Thomas I. Butler, Film Extrusion Manual: Process, Materials, Properties pp. 31-80 (published by TAPPI Press (1992)); "Coextrusion For Barrier Packaging," by W. J. Schrenk and C. R. Finch, Society of Plastics Engineers RETEC Proceedings, Jun. 15-17 (1981), pp. 211-229; K. R. Osborn and W. A. Jenkins; and Plastic Films, Technology and Packaging Applications (Technomic Publishing Co., Inc. (1992)), the disclosures of which are incorporated herein by reference.

After fabrication, the multilayer film of the present invention may be oriented (off-line or in a continuous operation) using methods and procedures well known in the art. Biaxial orientation processes such as tenter frames, "trapped bubble" and "double bubble" processes can be used to orient the film. Suitable techniques are described in U.S. Pat. No. 3,456,044 (Pahlke); U.S. Pat. No. 4,865,902 (Golike et al.); U.S. Pat. No. 4,352,849 (Mueller); U.S. Pat. No. 4,820,557 (Warren); U.S. Pat. No. 4,927,708 (Herran et al.); U.S. Pat. No. 4,963,419 (Lustig et al.); and U.S. Pat. No. 4,952,451 (Mueller), the disclosures of each of which are incorporated herein by reference.

EXAMPLES

Backsheets are made by coextruding multilayer films. The films have an inner layer of ATTANE 4202 ULDPE having a specific gravity of 0.915 (measured by ASTM D792) and a melt index ($I_2$) of 3.2 g/10 min (measured by ASTM D1238, Condition 190° C./2.16 kg). The films have a core layer of polypropylene (either INSPIRE D118.01 or INSPIRE D118.02 polypropylene resins, both available from The Dow Chemical Company). Example 1 has an outer layer of polypropylene resin (either INSPIRE D118.01 or INSPIRE D118.02 polypropylene resins) and the following UV and antioxidant stabilizers: 0.6 wt % CYASORB UV 3853 PPS, 0.3 wt % CYASORB THT 2001, 0.2 wt % UVINAL 5050H, 0.1 wt % TINUVIN 770, and 0.025 wt % IRGANOX 1010, all percentages based on the weight of polypropylene resin. Example 2 has an outer layer of KYNAR 710-PLT PVDF resin. Example 3 has an outer layer of a 50:50 blend of KYNAR 710-PLT PVDF resin and PLEXIGLAS HFI7-101 rubber modified PMMA resin. Example 4 has an outer layer of PLEXIGLAS HFI7-101 rubber modified PMMA resin. All of Examples 1-4 have tie layers between the inner layer and core layer and the core layer and the outer layer, in which the tie layers are a 50:50 blend of LOTRYL 24MA005 ethyl methyl acrylate (EMA) resin (24% methyl acrylate, 0.5 g/10 min MI) and LOTRYL 28MA07 EMA resin (28% methyl acrylate, 7 g/10 min ($I_2$)).

Examples 1-4 are laminated to different encapsulant films over a base layer of MADICO PHOTO-MARK TPE. Two commercial products, MADICO PHOTO-MARK TPE and ISOVOLTA TPT, are also laminated in the same way for comparison. The adhesion results are shown in Table 1. Additional test backsheets, the same as Examples 1-4 except the outer layer is HDPE, are also evaluated in the lamination test, but the results are not shown in Table 1. The laminated backsheets are also evaluated for shrinking, sticking, delaminating, curling/wrapping, wrinkling, adhesion to the encapsulant and overall aesthetics.

The test films with HDPE outer layers do not perform well in the lamination process in that they do not withstand the 140-150° C. temperature and take the imprint of the Teflon cover sheet. Backsheets with rubber modified PMMA (not blended with PVDF) do not perform in the lamination test due to a large amount of curl and taking an imprint of the Teflon cover sheet. Films with outer layers based on PP, PVDF, or PVDF/rubber modified PMMA blend do perform well in the lamination process in that the films look the same before and after lamination with no visible changes in aesthetics, curl, surface texture, color or size (no visible shrinking).

TABLE 1

Lamination adhesion testing

| Encapsulant | Backsheet | Load at Maximum (lb$_f$) | Average load between limits (lb$_f$) |
|---|---|---|---|
| A | Example 1 | 11.1 | 7.4 |
| A | Example 2 | 17.4 | 13.2 |
| A | Example 3 | 18.2 | 13.8 |
| A | MADICO PHOTO-MARK TPE | 59.4 | 56.2 |
| A | ISOVOLTA TPT | 4.6 | 3.4 |
| B | Example 1 | 25.8 | 22.8 |
| B | Example 2 | 16.6 | 12.6 |
| B | Example 3 | 18.0 | 14.0 |
| B | MADICO PHOTO-MARK TPE | 66.4 | 56.9 |
| B | ISOVOLTA TPT | 8.2 | 7.0 |
| EVA | Example 1 | 26.9 | 23.5 |
| EVA | Example 2 | 16.7 | 14.7 |
| EVA | Example 3 | 17.7 | 14.1 |
| EVA | MADICO PHOTO-MARK TPE | 45.0 | 40.8 |
| EVA | ISOVOLTA TPT | 45.9 | 32.1 |

The concept to improve the adhesion between PVDF and PP is that adding the MAH-grafted polymers to PVDF and PP layers and using E-GMA as the tie layer will create the strong chemical bonds between MAH-grafted PVDF & E-GMA and between MAH-grafted PP & E-GMA. MAH will react with GMA. Three multilayer films (3 layers), Examples 5, 6, and 7, were made on a 10 inch cast line. The layer structures, processing conditions, and the interlayer adhesion are shown in Tables 2, 3 and 4, respectively.

For Example 6, peeling started at the MAH-g-PVDF/E-GMA interface. E-GMA delaminated from MAH-g-PDVF and also gradually delaminated from PP. E-GMA deformed and tore apart. Delamination propagated at the E-GMA/PP interface. At 85° C., peeling started at the MAH-g-PVDF/E-GMA interface. For Example 7, peeling started at the MAH-g-PVDF/E-GMA interface. E-GMA delaminated from MAH-g-PVDF and did not delaminate from PP. E-GMA/PP deformed. At 85° C., peeling started at the MAH-g-PVDF/E-GMA interface. Same Mechanism was observed.

TABLE 2

| Sample ID# | Ex 5 | | | Ex 6 | | | Ex 7 | | |
|---|---|---|---|---|---|---|---|---|---|
| Layer # | 1 | 2 | 3 | 1 | 2 | 3 | 1 | 2 | 3 |
| Extruder # | B | C | A | B | C | A | B | C | S |
| Layer thickness, mil | 2 | 0.5 | 1.5 | 2 | 0.5 | 1.5 | 2 | 0.5 | 1.5 |
| Layer % | 50 | 12.5 | 37.5 | 50 | 12.5 | 37.5 | 50 | 12.5 | 37.5 |
| Materials, wt % | 100 | 100 | 100 | 100 | 100 | 100 | 100 | 100 | 100 |
| D188.01 PP (8.0 MFR@230° C.) | 100 | | | 100 | | | 70 | | |
| Kynar 710 PVDF (20 MFR@230° C./3.8 kg) | | | 100 | | | | | | |
| Kynar ADX 120 MAH-g-PVDF (12.5 MFR@230° C./5 kg) | | | | | | 1100 | | | 1100 |
| Lotader AX8840 E-GMA (105° C. Tm, 5 MI) | | 100 | | | 100 | | | 100 | |
| Polybond 3200 MAH-g-PP (250 MFR@ 230° C.) | | | | | | | 30 | | |

TABLE 3

| Processing Conditions | Ex 5 | | | Ex 6 | | | Ex 7 | | |
|---|---|---|---|---|---|---|---|---|---|
| Extruder # | B | C | A | B | C | A | B | C | A |
| Extruder temp ° F. | 390 | 310 | 460 | 390 | 310 | 460 | 390 | 310 | 460 |
| Extruder RPM | 31 | 15 | 50 | 31 | 15 | 50 | 31 | 15 | 50 |
| Feedblock temp ° F. | | 430 | | | 430 | | | 430 | |
| Die temp ° F. | | 430 | | | 430 | | | 430 | |
| Cast roll speed ft/min | | 15.0 | | | 9.9 | | | 13.4 | |
| Cast roll temp ° F. | | 78 | | | 78 | | | 78 | |

TABLE 4

| Sample | 180° peel (MD) Ave load, lbf/in | 180° peel (MD) Max load, lbf/in | Failure in MD | Notes | Peel @ 85° C. (MD) Ave load, lbf/in | Peel @ 85° C. (MD) Max load, lbf/in | Failure in MD at 85° C. |
|---|---|---|---|---|---|---|---|
| TPE Photomark | 1.52 | 2.13 | Delamination between PET & EVA; EVA torn | PVF/PET/ EVA | — | — | |
| Ex 5 | 0.02 | 0.06 | Delamination between PVDF & E-GMA | PP/E-GMA/ PVDF | 0.12 | 0.18 | Delamination between PVDF & E-GMA |
| Ex 6 | 2.9 | 3.5 | E-GMA delaminated deformed and then tore apart | PP/E-GMA/MAH-g-PVDF | 1.5 | 1.9 | E-GMA delaminated. Deformed and then tore |
| Ex 7 | >2.4 | >2.7 | Delamination between PVDF & E-GMA: PP/E-GMA deformed. | PP&MAH-g-PP blend/E-GMA/MAH-g-PVDF | >1.8 | >2.1 | Delamination between PVDF & E-GMA; PP/E-GMA deformed. |

Although the invention has been described in considerable detail through the preceding description and examples, this detail is for the purpose of illustration and is not to be construed as a limitation on the scope of the invention as it is described in the appended claims. All United States patents, published patent applications and allowed patent applications identified above are incorporated herein by reference.

What is claimed is:

1. A backsheet comprising a coextruded multilayer sheet that comprises:
   i) an inner layer comprising a polyolefin resin;
   ii) a core layer comprising a polypropylene resin, a blend of a polypropylene resin and a maleic anhydride grafted polypropylene (MAH-g-PP), or a polypropylene resin/MAH-g-PP multilayer structure;
   iii) an outer layer comprising a maleic anhydride grafted polyvinylidene fluoride (MAH-g-PVDF), a blend of a polyvinylidene fluoride (PVDF) and a MAH-g-PVDF, or a PVDF/MAH-g-PVDF multilayer structure;
   iv) a first tie layer between the core layer and the outer layer; and
   v) an optional second tie layer between the core layer and the inner layer.

2. The backsheet of claim 1, wherein the polyolefin resin is a heterogeneously branched ethylene-based interpolymer or a maleic anhydride-modified polyolefin.

3. The backsheet of claim 1, wherein the inner layer has a thickness between about 1 mil to about 5 mil.

4. The backsheet of claim 1 wherein one or more layers further comprise a pigment.

5. The backsheet of claim 1, wherein one or more layers further comprise at least one UV stabilizer or antioxidant.

6. The backsheet of claim 1, wherein the core layer has a thickness between about 1 and about 15 mil.

7. The backsheet of claim 1, wherein the first tie layer is an ethylene copolymer comprising at least one of an ethylene methacrylate resin (EMA), an ethylene glycidyl methacrylate resin (E-GMA), or an ethylene-methyl acrylate-glycidyl methacrylate resin (E-MA-(MA) or is a polyolefin having a functionality including a glycidyl methacrylate and an amine.

8. The backsheet of claim 1, wherein the first tie layer and/or the optional second tie layer, each has a thickness of between about 0.05 mil to 2 mil.

9. The backsheet of claim 1, wherein the second tie layer, when present, is an ethylene copolymer comprising at least one of an ethylene methacrylate resin (EMA), an ethylene glycidyl methacrylate resin (E-GMA), or an ethylene-methyl acrylate-glycidyl methacrylate resin (E-MA-GMA) or a polyolefin having a functionality including a glycidyl methacrylate and an amine.

10. A rigid photovoltaic cell panel, comprising:
   a photovoltaic cell;
   a backsheet comprising a coextruded multilayer sheet that comprises:
   i) an inner layer comprising a polyolefin resin;
   ii) a core layer comprising a polypropylene resin, a blend of a polypropylene resin and a maleic anhydride grafted polypropylene (MAH-g-PP), or a polypropylene resin/MAH-g-PP multilayer structure;
   iii) an outer layer comprising a maleic anhydride grafted polyvinylidene fluoride (MAH-g-PVDF), a blend of a polyvinylidene fluoride (PVDF) and a MAH-g-PVDF, or a PVDF/MAH-g-PVDF multilayer structure;

iv) a first tie layer between the core layer and the outer layer; and an optional second tie layer between the core layer and the inner layer.

11. A backsheet comprising a coextruded multilayer sheet, the sheet comprising:

a first layer comprising: (1) a blend of PVDF and MAH-g-PVDF; (2) MAH-g-PVDF; or (3) a two-layer structure comprising a layer of PVDF and a layer of MAH-g-PVDF;

a second layer comprising: (1) a polypropylene resin; (2) a blend of a polypropylene resin and a maleic anhydride grafted polypropylene (MAH-g-PP); or, (3) a two-layer structure comprising a layer of polypropylene resin and a layer of MAH-g-PP; and a first tie layer interposed between, and in contact with, the first layer and the second layer, the first tie layer comprising at least one of an ethylene methacrylate resin (EMA), an ethylene glycidyl methacrylate resin (E-GMA), or an ethylene-methyl acrylate-glycidyl methacrylate resin (E-MA-GMA) or a polyolefin having a functionality including a glycidyl methacrylate and an amine, wherein: (1) when the first layer comprises a two-layer structure, then the layer of MAH-g-PVDF is in contact with the first tie layer; and, (2) when the second layer comprises a two-layer structure, then the layer of MAH-g-PP is in contact with the first tie layer.

12. The backsheet claim 11, wherein the multilayer sheet further comprises:

a third layer comprising a polyolefin resin; and, a second tie layer interposed between, and in contact with, the third layer and the second layer, wherein the second tie layer is an ethylene copolymer comprising at least one of an ethylene methacrylate resin (EMA), an ethylene glycidyl methacrylate resin (E-GMA), or an ethylene-methyl acrylate-glycidyl methacrylate resin (E-MA-GMA) or is a polyolefin having a functionality including a glycidyl methacrylate and an amine.

13. The backsheet of claim 12, wherein the polyolefin resin is a heterogeneously branched ethylene-based interpolymer or a maleic anhydride-modified polyolefin.

14. The backsheet of claim 11 wherein the first layer has a thickness between about 1 to about 5 mil.

15. The backsheet of claim 11 wherein the second layer has a thickness between about 1 to about 15 mil.

16. The backsheet of claim 11 wherein the first tie layer has a thickness between about 0.05 to about 2 mil.

17. The backsheet of claim 11 wherein the sheet further comprises an encapsulant film adjacent to the second layer or attached to the second layer by a third tie layer.

18. The backsheet of claim 17, wherein the encapsulant film comprises a silane-functionalized resin.

19. A method for making a backing sheet, the method comprising coextruding a multilayer film having i) an inner layer comprising a polyolefin resin;

ii) a core layer comprising a polypropylene resin, a blend of a polypropylene resin and a maleic anhydride grafted polypropylene (MAH-g-PP), or a polypropylene resin/MAH-g-PP multilayer structure;

iii) an outer layer comprising a maleic anhydride grafted polyvinylidene fluoride (MAH-g-PVDF), a blend of a polyvinylidene fluoride (PVDF) and a MAH-g-PVDF, or a PVDF/MAH-g-PVDF multilayer structure;

iv) a first tie layer between the core layer and the outer layer; and v) an optional second tie layer between the core layer and the inner layer.

* * * * *

UNITED STATES PATENT AND TRADEMARK OFFICE
CERTIFICATE OF CORRECTION

PATENT NO. : 8,481,154 B2  Page 1 of 1
APPLICATION NO. : 12/872028
DATED : July 9, 2013
INVENTOR(S) : Chu et al.

It is certified that error appears in the above-identified patent and that said Letters Patent is hereby corrected as shown below:

In the Specification

In column 11, table 2, sample ID # Kynar ADX 120 MAH- example 6 replace "1100" with --100--.

In column 11, table 2, sample ID # Kynar ADX 120 MAH- example 7 replace "1100" with --100--.

Signed and Sealed this
First Day of October, 2013

Teresa Stanek Rea
*Deputy Director of the United States Patent and Trademark Office*